(12) United States Patent
Jiang et al.

(10) Patent No.: US 11,697,710 B2
(45) Date of Patent: Jul. 11, 2023

(54) COLORLESS POLYIMIDE FILM CONTAINING FLUORINE AND CARDO STRUCTURE AND PREPARATION METHOD THEREOF

(71) Applicants: RayiTEK Hi-tech Film Company, Ltd., Shenzhen, Shenzhen (CN); Jiaxing RAYITEK Film Technology Co., Ltd., Jiaxing (CN)

(72) Inventors: YanYan Jiang, Shangrao (CN); ZhenZhong Wang, Zhuzhou (CN); Xi Ren, Yueyang County (CN); Wei Zhang, Guilin (CN)

(73) Assignees: RAYITEK Hi-Tech Film Company, Ltd., Shenzhen, Shenzhen (CN); Jiaxing RAYITEK Film Technology Co., Ltd., Jiaxing (CN)

( * ) Notice: Subject to any disclaimer, the term of this patent is extended or adjusted under 35 U.S.C. 154(b) by 231 days.

(21) Appl. No.: 16/533,911

(22) Filed: Aug. 7, 2019

(65) Prior Publication Data
US 2021/0040266 A1     Feb. 11, 2021

(51) Int. Cl.
| | | |
|---|---|---|
| C08G 73/10 | (2006.01) | |
| C08J 5/18 | (2006.01) | |
| B29C 41/46 | (2006.01) | |
| B29C 41/00 | (2006.01) | |
| B29K 79/00 | (2006.01) | |
| B29L 7/00 | (2006.01) | |
| H10K 77/10 | (2023.01) | |

(52) U.S. Cl.
CPC ........ C08G 73/1067 (2013.01); B29C 41/003 (2013.01); B29C 41/46 (2013.01); C08G 73/1021 (2013.01); C08G 73/1032 (2013.01); C08G 73/1078 (2013.01); C08J 5/18 (2013.01); *B29K 2079/08* (2013.01); *B29K 2995/0026* (2013.01); *B29L 2007/008* (2013.01); *C08J 2379/08* (2013.01); *H10K 77/111* (2023.02)

(58) Field of Classification Search
CPC . C08L 79/08; C08G 73/1039; C08G 73/1042; C08G 73/1078; C08G 73/1075; C08J 2479/08; C08J 2379/08
See application file for complete search history.

(56) References Cited

U.S. PATENT DOCUMENTS

| | | | |
|---|---|---|---|
| 2008/0020217 A1 | 1/2008 | Makinoshima et al. | |
| 2019/0092913 A1* | 3/2019 | Sakayori | C08J 5/18 |
| 2019/0153158 A1* | 5/2019 | Kondo | C08G 73/1042 |
| 2019/0202988 A1 | 7/2019 | Abiko et al. | |

* cited by examiner

*Primary Examiner* — Gregory Listvoyb
(74) *Attorney, Agent, or Firm* — Standley Law Group LLP; Beverly A. Marsh; Kenny W. Pung

(57) ABSTRACT

A polyimide film contains fluorinated substituents and cardo structures. The polyimide film exhibits excellent heat-resistance, transparency and mechanical properties. The polyimide film has a glass-transition temperature (Tg) of at least 360° C., a coefficient of thermal expansion (CTE) of 50 ppm/° C. or lower, a modulus of at least 4.0 Gpa, a b* value of 5 or lower and yellowness index of 8 or less. The polyimide film can be used as a display substrate or an optical film in a liquid crystal display (LCD), an organic light-emitting diode (OLED) and in other fields where the characteristic features are required.

14 Claims, No Drawings

COLORLESS POLYIMIDE FILM CONTAINING FLUORINE AND CARDO STRUCTURE AND PREPARATION METHOD THEREOF

CROSS-REFERENCE TO RELATED APPLICATIONS

This application is a non-provisional application and makes no claim of priority.

TECHNICAL FIELD

The disclosure relates to a polyamic acid solution and method for manufacturing a transparent polyimide film with enhanced heat resistance from the polyimide acid solution above.

BACKGROUND

In past few years, glass was the first option to be used as substrate to fabricate optoelectronic devices. However, currently optoelectronic device development is trending towards flexible, it means that glass is difficult to adapt to this new trend because of its fragile nature. At this time, polymeric material would be a good substitute for glass. As we have known, many of polymeric materials can exhibit good optical properties like glass and excellent flexibility. But, beyond optical properties and flexibility, good thermal stability and dimensional stability are also required for flexible substrate application, because high temperature processing is involved in device fabrication such as flexible display, including OLED display, often needs to be manufactured at high temperature, for example, the process temperature of oxide thin-film transistor (TFT) and low temperature polysilicon (LTPS) is usually above 350° C., sometimes up to 500° C.

Therefore, it is critical to develop polyimides with excellent heat resistance, optical transparency and mechanical properties.

Polyimides have shown outstanding stability at high temperature processing compared with other polymer materials. Nevertheless, due to charge transfer complex (CTC) interaction occurring between aromatic rings traditional polyimide films are dark brown or yellow colored.

In earlier work, in order to minimize intermolecular or intramolecular charge transfer interactions and produce colorless, transparent polyimides, a linkage group such as sulfone (—SO$_2$), hexafluoro isopropyl, ether (—O—), or side chains with bulky substituents creating large free volume or alicyclic structure in the polyimide backbone were introduced.

In many cases significant thermal stability will be sacrificed due to the introduction of these functional groups. However, it is still critical to develop the transparent polyimide with high glass-transition temperature. Therefore, in this present invention, fluorinated substituents and cardo structures were introduced into the polymer backbone and optimize the proportion of these groups to produce transparent polyimide film having a high thermal stability. The polyimide film disclosed in the present invention can be used as a display substrate, optical film in liquid crystal display (LCD), organic light-emitting diode (OLED) and other fields.

SUMMARY

The present invention is intended to provide a polyamic acid solution, which is copolymerized by selected tetracarboxylic dianhydrides and diamines. And according to the present invention, the repeating unit of a polyamic acid contains at least one fluorinated substituent and one cardo structure.

The polyamic acid solution is co-polymerized by diamines which comprise Structural Formula 1 or Structural Formula 1 and Structural Formula 2 and tetracarboxylic dianhydrides which comprise Structural Formula 3, Structural Formula 4 or Structural Formula 3, Structural Formula 4 and Structural Formula 5 in organic solvent. The diamines comprise a combination of Structural Formula 1 or Structural Formula 1 and Structural Formula 2. The tetracarboxylic dianhydrides comprises a combination of Structural formula 3, Structural formula 4 or a combination of Structural formula 3, Structural formula 4 and Structural formula 5.

Structural formula 1 is:

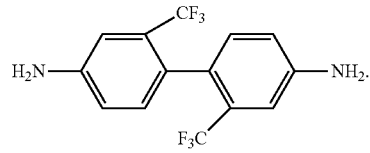 [SMILES: Nc1ccc(-c2ccc(N)cc2C(F)(F)F)c(C(F)(F)F)c1]

Structural formula 2 is:

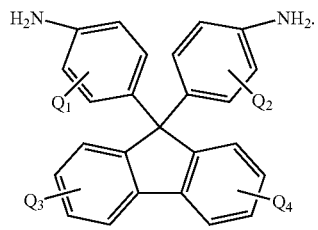

In Structural Formula 2, $Q_1$, $Q_2$, $Q_3$ and $Q_4$ are each independently selected from a hydrogen, halogen atom such as —F, —Cl, —Br, —I or a hydroxyl group (—OH), a thiol group (—SH), a nitro group (—NO$_2$), a $C_{1-10}$ alkyl group, a $C_{1-4}$ halogenoalkoxyl group, a $C_{1-10}$ halogenoalkyl group, a cyano group, and a $C_{6-20}$ aryl group, and preferably, it may be a substituent selected from a hydrogen, a halogen atom, a hydroxyl group, a halogenoalkyl, an alkyl group, an aryl group and a cyano group. For example, the halogen atom may be fluorine (—F), the halogenoalkyl may be a $C_{1-10}$ fluoroalkyl containing a fluorine atom selected from a fluoromethyl group, a perfluoroethyl group, a trifluoromethyl group and the like, the alkyl group may be selected from a methyl group, ethyl group, propyl group, isopropyl group, t-butyl group, pentyl group, and naphthalenyl group. More preferably, the substituent may be a fluoro-based substituent comprising fluorine atom, a flux-roalkyl group containing a fluorine.

Structural formula 3 is:

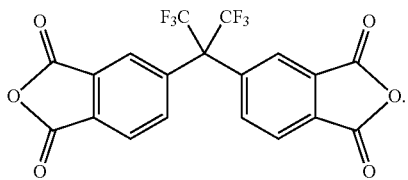 [SMILES: O=C1OC(=O)c2cc(C(c3ccc4c(c3)C(=O)OC4=O)(C(F)(F)F)C(F)(F)F)ccc21]

Structural Formula 4 is:

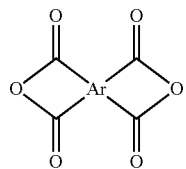

In Structural Formula 4, Ar can be selected from any of the following groups:

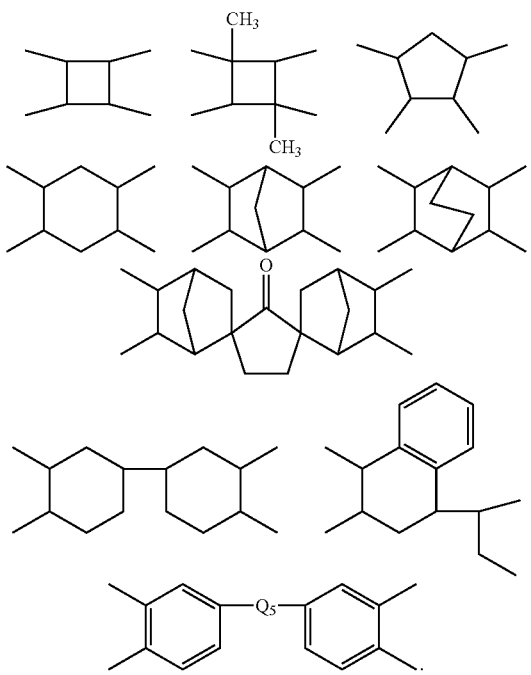

Structural Formula 5 is:

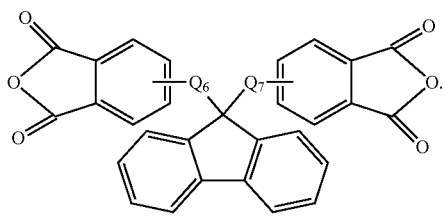

In Structural Formula 4 and Structural Formula 5, $Q_5$, $Q_6$ and $Q_7$ are each independently selected from the group comprising a single bond, —O—, —S—, —$SO_2$—, —C(=O)—, —C(=O)O—, —C(=O)NH—, a phenylene group and a combination thereof.

According to one embodiment of the present invention, the molar ratio of the total amount of the diamine and the total amount of the tetracarboxylic dianhydride is 1:0.98~1:1.1, preferably 1:1~1:1.05. The reaction temperature is −20° C.~60° C. with the reaction time of 4~48 hr in a nitrogen or argon atmosphere for preparing a polyamic acid.

According to the present invention the organic solvent for using in polymerizing the diamine and tetracarboxylic dianhydride may comprise one or more selected from amide solvents such as N-methyl-2-pyrrolidone (NMP), dimethylformamide (DMF), dimethylacetamide (DMAc) and dimethylsulfoxide (DMSO); cyclic ester solvents such as γ-valerolactone, γ-butyrolactone and α-methyl-γ-butyrolactone; phenol solvents such as m-cresol and p-cresol; sulfolane, acetophenone and other solvents having a low boiling point. The solvents used in the present invention are not limited to the above solvents.

The solid content based on a polyamic acid solution is preferably, but not limited to, 10 mass % to 40 mass %, more preferably 15 mass % to 35 mass %, relative to the total amount of polyamic acid and the solvent.

In the preferred embodiment, the composition of the polyamic acid solution comprises diamines and tetracarboxylic dianhydrides, wherein the diamines are a combination of Structural formula 1 and Structural formula 2, and the amount of Structural formula 1 is 60 mol % or more.

In tetracarboxylic dianhydrides, the amount of Structural formula 3 is 10~40 mol %, the amount of Structural formula 4 is 30~80 mol %, the amount of Structural formula 5 is 0~50 mol %.

In another preferred embodiment, the composition of the polyamic acid solution comprises diamines and tetracarboxylic dianhydrides, wherein the diamines are Structural formula 1 in an amount of 60~95 mol % and Structural formula 2 in an amount of 5~40 mol %, and the tetracarboxylic dianhydrides are Structural formula 3 in an amount of 10~40 mol % and Structural formula 4 in an amount of 60~90 mol %.

According to another preferred embodiment, the composition of the polyamic acid solution comprises diamine and tetracarboxylic dianhydrides, wherein the diamine is Structural formula 1, and the tetracarboxylic dianhydrides are Structural formula 3 in an amount of 10~30 mol %, Structural formula 4 in an amount of 30~80 mol % and Structural formula 5 in an amount of 5~50 mol %.

Another purpose of the present invention is to provide a transparent polyimide film, which is prepared from the polyamic acid solution above. Wherein the glass-transition temperature (Tg) is 360° C. or higher, coefficient of thermal expansion (CTE) is 50 ppm/QC or lower, birefringence is 0.06 or less, b* value is 5 or lower, yellowness index is 8 or less, modulus is 4.0 Gpa or more; and the polyimide film has a transmittance of 88% or more at 550 nm and a haze of 0.5% or less. The transparent polyimide film according to the present invention has a high glass transition temperature (Tg) and a low coefficient of thermal expansion (CTE). It has excellent heat resistance and good optical properties, and thus can be used as substrate in display or semiconductor field.

Another purpose of the present invention is to provide a method of preparing transparent polyimide film above. In a first step, the polyamic acid solution is mixed with an imidization catalyst, allowing the imidization catalyst to be fully intermixed. The reacted is then applied onto a substrate as a coating. The coated substrate is heated and dried in an oven to remove the solvent, forming a pre-coating film. This pre-coating film may be stripped from the substrate and fixed on a stainless steel frame for imidization (dehydration and ring-closing) by heat treatment, or casting the mixture on a glass plate, then removing the solvent and imidizing the polyamic acid by heat treatment directly, and thus to obtain the polyimide film.

The polyamic acid solution can also be directly coated on the substrate and then the polyimide film can be obtained in the same way.

In yet a further manner, the polyamic acid solution can be mixed with imidization catalyst and dehydrating agent, and then the polyimide film can be obtained in the same way. According to the present invention, the preferred method of preparing transparent polyimide film is to conduct the imidization on the substrate.

It is preferred that the heat treatment involves drying in the temperature range of 50~180° C., preferably 80~150° C., and then heating at the highest heating temperature of 300~500° C. to complete imidization, preferably 300~400° C. The heat treatment is usually carried out in an air atmosphere or in a nitrogen atmosphere, preferably in a nitrogen atmosphere.

According to one embodiment of the present invention, the polyamic acid solution composition may comprise an imidization catalyst such as imidazole compounds, benzimidazole compounds, quinolone compounds, pyridine and isoquinoline compounds, etc. Wherein, the imidization catalyst may be utilized alone or in combination of two or more types. The amount of the imidization catalyst to be added is preferably in the range of 0.1~10 mass %, more preferably 0.9~7 mass %, relative to the total amount of polyamic acid polymer mass.

In addition, the thickness of the polyimide film is not particularly limited, but is preferably set to 5~250 μm, and more preferably 10~60 μm.

BEST MODE

In the present invention, examples will be described in more details below, but is not limited to the following examples.

The polymer components used in the embodiment are described below and are all marketed products:

TFMB: 2,2'-bis(trifluoromethyl)benzidine
BAFL: 9,9'-bis(4-aminophenyl)fluorene
FFDA: 9,9'-bis(4-amino-3-fluorophenyl)fluorene
6FDA: 4,4'-(hexafluoroisopropylidene)diphthalic anhydride
s-BPDA: 3,3',4,4'-biphenyl tetracaboxylic dianhydride
BPAF: 9,9'-bis(phthalic anhydride) fluorene
CBDA: Cyclobutane-1,2,3,4-tetracarboxylic dianhydride
Isoquinoline The methods for measuring the properties are as described below:

Light Transmittance, b*, Haze, Yellowness Index

The Light Transmittance, b* value, Haze and yellowness index of the film in each of the examples and comparative examples was measured using a UV spectrophotometer (X-rite Ci7800), all the values were averaged.

Birefringence

The birefringence of the film of each of the examples and comparative examples was measured at 637 nm in TE (Transverse Electric) mode and TM (Transverse Magnetic) mode using a prism coupler (Metricon 2010/M).

Glass-Transition Temperature (Tg))

The glass-transition temperature of the films in each of the examples and comparative examples were measured with Dynamic Mechanical Analyzer (DMA850) under the conditions of load of 0.05N, a heating rate of 3° C./min and a nitrogen atmosphere at 200° C. to 500° C., and then a inflection point of a curve with the max value was recorded as a glass-transition temperature.

Coefficient of Thermal Expansion (CTE))

The coefficient of thermal expansion (CTE) of the film in each of the examples and comparative examples were measured two times at 50~250° C. with Thermo Mechanical Analyzer (TMA 71000), the heating rate of first test was 10° C./min and the second test was 5° C. min, and a load of 20 mN was applied. The residual stress may have remained in the thermally treated film, but it can be completely removed upon the first scan. Therefore, the second value of the present invention is represented as the actual CTE value.

EXAMPLES

Example 1

In a 500 reactor, which was equipped with a stirrer, nitrogen inlet and a temperature controller, 230.49 g of dimethylacetamide (DMAc) was placed as a solvent. Then 25.618 g (0.08 mol) of TFMB, 6.969 g (0.02 mol) of BAFL were dissolved. Thereafter, 8.885 g (0.02 mol) of 6FDA and 23.538 g (0.08 mol) of s-BPDA were added to the diamine solution, respectively. The resulting solution was kept at room temperature and reacted for 12 hr to 24 hr, then obtained a polyamic acid solution with the solid content of 22 wt %.

Isoquinoline 3.25 g (0.0252 mol) was added to the polyamic acid solution with stirring for 1 hr. After degassing, the polyamic acid solution was applied on a substrate with a bar coater. The coating film was dried at 100° C. for 10 min, then peeled off from the substrate and fixed on stainless steel frame, and then heated from 150° C. to 300° C. for 30 min, and kept at 300° C. for 15 min, slowly cooled, and separated from the frame to obtain the polyimide film.

Example 2

In a 500 mL reactor, which was equipped with a stirrer, nitrogen inlet and a temperature controller, 229.49 g of dimethylacetamide (DMAc) was placed as a solvent. Then 28.821 g (0.09 mol) of TFMB, 3.484 g (0.01 mol) of BAFL were dissolved. Thereafter, 8.885 g (0.02 mol) of 6FDA and 23.538 g (0.08 mol) of s-BPDA were added to the diamine solution, respectively. The resulting solution was kept at room temperature and reacted for 12 hr to 24 hr, then obtained a polyamic acid solution with the solid content of 22 wt %.

Isoquinoline 3.24 g (0.0251 mol) was added to the polyamic acid solution with stirring for 1 hr. And then a polyimide film was formed in the same way as in example 1.

Example 3

In a 500 mL reactor, which was equipped with a stirrer, nitrogen inlet and a temperature controller, 234.80 g of dimethylacetamide (DMAc) was placed as a solvent. Then 28.821 g (0.09 mol) of TFMB, 3.484 g (0.01 mol) of BAFL were dissolved. Thereafter, 13.327 g (0.03 mol) of 6FDA and 20.595 g (0.07 mol) of s-BPDA were added to the diamine solution, respectively. The resulting solution was kept at room temperature and reacted for 12 hr to 24 hr, then obtained a polyamic acid solution with the solid content of 22 wt %.

Isoquinoline 3.31 g (0.0256 mol) was added to the polyamic acid solution with stirring for 1 hr. And then a polyimide film was formed in the same way as in example 1.

Example 4

In a 500 mL reactor, which was equipped with a stirrer, nitrogen inlet and a temperature controller, 241.13 g of dimethylacetamide (DMAc) was placed as a solvent. Then 25.618 g (0.08 mop of TFMB, 6.969 g (0.02 mol) of BAFL were dissolved. Thereafter, 17.770 g (0.04 mol) of 6FDA and 17.653 g (0.06 mol) of s-BPDA were added to the diamine solution, respectively. The resulting solution was kept at room temperature and reacted for 12 hr to 24 hr, then obtained a polyamic acid solution with the solid content of 22 wt %.

Isoquinoline 3.40 g (0.0263 mol) was added to the polyamic acid solution with stirring for 1 hr. And then a polyimide film was formed in the same way as in example 1.

Example 5

In a 500 mL reactor, which was equipped with a stirrer, nitrogen inlet and a temperature controller, 241.40 g of dimethylacetamide (DMAc) was placed as a solvent. Then 28.821 g (0.09 mol) of TFMB, 3.844 g (0.01 mol) of FFDA were dissolved. Thereafter, 17.770 g (0.04 mol) of 6FDA and 17.653 g (0.06 mol) of s-BPDA were added to the diamine solution, respectively. The resulting solution was kept at room temperature and reacted for 12 hr to 24 hr, then obtained a polyamic acid solution with the solid content of 22 wt %.

Isoquinoline 3.40 g (0.0263 mol) was added to the polyamic acid solution with stirring for 1 hr. And then a polyimide film was formed in the same way as in example 1.

Example 6 in a 500 mL reactor, which was equipped with a stirrer, nitrogen inlet and a temperature controller, 243.68 g of dimethylacetamide (DMAc) was placed as a solvent. Then 25.618 g (0.08 mol) of TFMB, 7.688 g (0.02 mol) of FFDA were dissolved. Thereafter, 17.770 g (0.04 mol) of 6FDA and 17.653 g (0.06 mol) of s-BPDA were added to the diamine solution, respectively. The resulting solution was kept at room temperature and reacted for 12 hr to 24 hr, then obtained a polyamic acid solution with the solid content of 22 wt %.

Isoquinoline 3.44 g (0.0266 mol) was added to the polyamic acid solution with stirring for 1 hr. And then a polyimide film was formed in the same way as in example 1.

Example 7

In a 500 mL reactor, which was equipped with a stirrer, nitrogen inlet and a temperature controller, 240.13 g of dimethylacetamide (DMAc) was placed as a solvent. Then 32.023 g (0.1 mol) of TFMB was dissolved. Thereafter, 8.885 g (0.02 mol) of 6FDA, 17.653 g (0.06 mol) of s-BPDA and 9.169 g (0.02 mol) of BPAF were added to the TFMB solution, respectively. The resulting solution was kept at room temperature and reacted for 12 hr to 24 hr, then obtained a polyamic acid solution with the solid content of 22 wt %.

Isoquinoline 3.39 g (0.0262 mol) was added to the polyamic acid solution with stirring for 1 hr. And then a polyimide film was formed in the same way as in example 1.

Example 8

In a 500 mL reactor, which was equipped with a stirrer, nitrogen inlet and a temperature controller, 239.63 g of dimethylacetamide (DMAc) was placed as a solvent. Then 32.023 g (0.1 mol) of TFMB was dissolved. Thereafter, 13.327 g (0.03 mol) of 6FDA, 17.653 g (0.06 mol) of s-BPDA and 4.584 g (0.01 mol) of BPAF were added to the TFMB solution, respectively. The resulting solution was kept at room temperature and reacted for 12 hr to 24 hr, then obtained a polyamic acid solution with the solid content of 22 wt %.

Isoquinoline 3.38 g (0.0262 mol) was added to the polyamic acid solution with stirring for 1 hr. And then a polyimide film was formed in the same way as in example 1.

Example 9

In a 500 mL reactor, which was equipped with a stirrer, nitrogen inlet and a temperature controller, 238.36 g of dimethylacetamide (DMAc) was placed as a solvent. Then 32.023 g (0.1 mol) of TFMB was dissolved. Thereafter, 22.922 g (0.05 mol) of BPAF, 4.442 g (0.01 mol) of 6FDA and 7.844 g (0.04 mol) of CBDA were added to the TFMB solution, respectively. The resulting solution was kept at room temperature and reacted for 12 hr to 24 hr, then obtained a polyamic acid solution with the solid content of 22 wt %.

Isoquinoline 3.36 g (0.026 mol) was added to the polyamic acid solution with stirring for 1 hr. And then a polyimide film was formed in the same way as in example 1.

Comparative Example 1

In a 500 mL reactor, which was equipped with a stirrer, nitrogen inlet and a temperature controller, 228.49 g of dimethylacetamide (DMAc) was placed as a solvent. Then 32.023 q (0.1 mol) of TFMB was dissolved. Thereafter, 8.885 g (0.02 mol) of 6FDA and 23.538 g (0.08 mol) of s-BPDA were added to the TFMB solution, respectively. The resulting solution was kept at room temperature and reacted for 12 hr to 24 hr, then obtained a polyamic acid solution with the solid content of 22 wt %.

Isoquinoline 3.22 g (0.0249 mol) was added to the polyamic acid solution with stirring for 1 hr. And then a polyimide film was formed in the same way as in example 1.

Comparative Example 2

In a 500 mL reactor, which was equipped with a stirrer, nitrogen inlet and a temperature controller, 306.573 g of dimethylacetamide (DMAc) was placed as a solvent. Then 32.023 g (0.1 mol) of TFMB was dissolved. Thereafter, 17.77 g (0.04 mol) of 6FDA and 17.653 g (0.06 mid) of s-BPDA were added to TFMB solution, respectively. The resulting solution was kept at room temperature and reacted for 12 hr to 24 hr, then obtained a polyamic acid solution with the solid content of 22 wt %.

Isoquinoline 3.37 g (0.0261 mol) was added to the polyamic acid solution with stirring for 1 hr. And then a polyimide film was formed in the same way as in example 1.

Comparative Example 3

In a 500 mL reactor, which was equipped with a stirrer, nitrogen inlet and a temperature controller, 221.85 g of dimethylacetamide (DMAc) was placed as a solvent. Then 19.214 g (0.06 mol) of TFMB and 13.938 g (0.04 mol) of BAFL were dissolved. Thereafter, 29.422 g (0.1 mol) of s-BPDA was added to the diamine solution. The resulting solution was kept at room temperature and reacted for 12 hr to 24 hr, then obtained a polyamic add solution with the solid content of 22 wt %.

Isoquinoline 3.13 g (0.0242 mol) was added to the polyamic add solution with stirring for 1 hr. And then a polyimide film was formed in the same way as in example 1.

Comparative Example 4

In a 500 mL reactor, which was equipped with a stirrer, nitrogen inlet and a temperature controller, 271.04 g of dimethylacetamide (DMAc) was placed as a solvent. Then 32.023 g (0.1 mol) of TFMB was dissolved. Thereafter, 44.424 g (0.1 mol) of 6FDA was added to the diamine solution. The resulting solution was kept at room temperature and reacted for 12 hr to 24 hr, then obtained a polyamic add solution with the solid content of 22 wt %.

Isoquinoline 3.8° g (0.0296 mol) was added to the polyamic add solution with stirring for 1 hr. And then a polyimide film was formed in the same way as in example 1.

As shown in Tables 1 and 2 below, the polyimide film of Examples 1 to 9 of the present invention has a high transparency, and the glass-transition temperature is 360° C. or more, even close to 390° C. in addition, the polyimide film of the present invention has a coefficient of thermal expansion (CTE) of 50 ppm/° C. or less, a modulus of 4.0 Gpa or more, and a yellowness index of 8 or less. The Comparative Examples 1 to 4 of Table 2 show that the polyimide film exhibits an increased glass transition temperature by introducing a cardo structure. Besides, the polyimide film with a higher content of fluorinated substituent shows a higher transparency according to the Examples 1 to 9 of Table 1 and Table 2. By the comparison of Example 1, Example 2 and Comparative Example 1, when a cardo structure was introduced on the basis of Comparative Example 1, the glass transition temperature could be significantly increased. While Comparative Example 3 shows that when the content of the cardo structure in diamine was too high, the mechanical properties and optical properties of the film were decreased (such as the yellowness index increased). Therefore, the polyimide film according to the present invention can be optimized by adjusting the contents of the fluorinated substituent and the cardo structure to possess the excellent heat-resistance, transparency and high modulus at the same time, and thus can be used as display substrate, optical film in liquid crystal display (LCD), organic light-emitting diode (OLED) and other fields.

TABLE 1

|  |  | Ex. 1 | Ex. 2 | Ex. 3 | Ex. 4 | Ex. 5 | Ex. 6 | Ex. 7 |
| --- | --- | --- | --- | --- | --- | --- | --- | --- |
| polyamic acid (molar ratio) |  |  |  |  |  |  |  |  |
| diamine | TFMB | 80 | 90 | 90 | 80 | 90 | 80 | 100 |
|  | BAFL | 20 | 10 | 10 | 20 |  |  |  |
|  | FFDA |  |  |  |  | 10 | 20 |  |
|  | 6FDA | 20 | 20 | 30 | 40 | 40 | 40 | 20 |
| tetracarboxylic | s-BPDA | 80 | 80 | 70 | 60 | 60 | 60 | 60 |
| dianhydride | BPAF |  |  |  |  |  |  | 20 |
|  | CBDA |  |  |  |  |  |  |  |
| Catalyst (solid content/%) | Isoquinoline | 5 | 5 | 5 | 5 | 5 | 5 | 5 |
| polyimide film |  |  |  |  |  |  |  |  |
| film thickness (μm) |  | 23 | 25 | 23 | 27 | 24 | 26 | 24 |
| Tg (° C.) |  | 389 | 377 | 376 | 369 | 367 | 365 | 370 |
| $CTE^{2nd}$@50-250° C./ppm · ° C.$^{-1}$ |  | 34 | 33 | 39 | 45 | 49 | 49 | 46 |
| Young's modular (Gpa) |  | 4.2 | 4.4 | 4.3 | 4.0 | 4.0 | 4.0 | 4.3 |
| b* |  | 4.7 | 3.4 | 3.2 | 3.7 | 2.4 | 2.8 | 2.1 |
| Yellowness Index |  | 7.6 | 5.8 | 5.2 | 6.0 | 4.0 | 4.6 | 3.5 |
| birefringence |  | 0.04 | 0.05 | 0.04 | 0.03 | 0.03 | 0.02 | 0.03 |
| Transmittance at 550 nm (%) |  | 88.3 | 88.4 | 88.7 | 88.9 | 89.2 | 89.1 | 88.8 |
| Haze (%) |  | 0.23 | 0.3 | 0.31 | 0.32 | 0.22 | 0.15 | 0.15 |

TABLE 2

|  |  | Ex. 8 | Ex. 9 | Comp. Ex. 1 | Comp. Ex. 2 | Comp. Ex. 3 | Comp. Ex. 4 |
| --- | --- | --- | --- | --- | --- | --- | --- |
| polyamic acid (molar ratio) |  |  |  |  |  |  |  |
| diamine | TFMB | 100 | 100 | 100 | 100 | 60 | 100 |
|  | BAFL |  |  |  |  | 40 |  |
|  | FFDA |  |  |  |  |  |  |
|  | 6FDA | 30 | 10 | 20 | 40 |  | 100 |

TABLE 2-continued

|  |  | Ex. 8 | Ex. 9 | Comp. Ex. 1 | Comp. Ex. 2 | Comp. Ex. 3 | Comp. Ex. 4 |
|---|---|---|---|---|---|---|---|
| tetracarboxylic dianhydride | s-BPDA | 60 |  | 80 | 60 | 100 |  |
|  | BPAF | 10 | 50 |  |  |  |  |
|  | CBDA |  | 40 |  |  |  |  |
| Catalyst (solid content/%) | Isoquinoline | 5 | 5 | 5 | 5 | 5 | 5 |
| polyimide film |  |  |  |  |  |  |  |
| film thickness (μm) |  | 23 | 26 | 26 | 25 | 25 | 25 |
| Tg (° C.) |  | 365 | 389 | 362 | 357 | 417 | 340 |
| $CTE^{2nd}$@50-250° C./ppm · ° $C.^{-1}$ |  | 46 | 31 | 30 | 48 | 37 | 65 |
| Young's modular (Gpa) |  | 4.2 | 4.6 | 4.7 | 4.2 | / | 3.7 |
| b* |  | 2.0 | 1.3 | 2.5 | 2.0 | 9.1 | 1.3 |
| Yellowness Index |  | 3.5 | 2.5 | 4.24 | 3.5 | 14.1 | 2.5 |
| birefringence |  | 0.04 | 0.03 | 0.06 | 0.04 | 0.03 | 0.01 |
| Transmittance at 550 nm (%) |  | 89.0 | 89.3 | 88.6 | 89.3 | 87.4 | 90.7 |
| Haze (%) |  | 0.17 | 0.2 | 0.44 | 0.2 | 0.41 | 0.1 |

What is claimed is:

1. A polyamic acid solution, comprising:

a product, containing at least one fluorinated substituent and one cardo structure, obtained by co-polymerizing, in an organic solvent, at least one diamine and at least one tetracarboxylic dianhydride;

wherein the molar ratio of total amount of diamine to the total amount of tetracarboxylic dienhydride is in the range of from 0.98 to 1.1;

wherein the at least one diamine is a monomer having Structural Formula 1;

wherein the at least one tetracarboxylic dianhydride is a combination of three monomers selected from Structural Formula 3, Structural Formula 4, and Structural Formula 5, such that, in the tetracarboxylic dianhydride:

Structural Formula 3 is present in the range of from 10 mol % to 30 mol %,

Structural Formula 4 is present in the range of from 30 mol % to 80 mol %, and

Structural Formula 5 is present in the range of from 5 mol % to 50 mol %;

wherein Structural Formula 1 is:

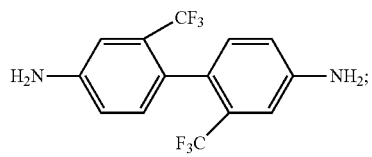 [SMILES: Nc1ccc(-c2ccc(N)cc2C(F)(F)F)c(C(F)(F)F)c1]

wherein Structural Formula 3 is:

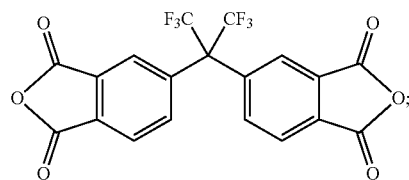 [SMILES: O=C1OC(=O)c2cc(C(c3ccc4c(c3)C(=O)OC4=O)(C(F)(F)F)C(F)(F)F)ccc21]

wherein Structural Formula 4 is:

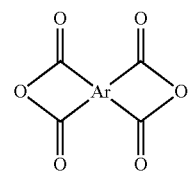

in which the substituent Ar is selected from the group consisting of any of the following structures:

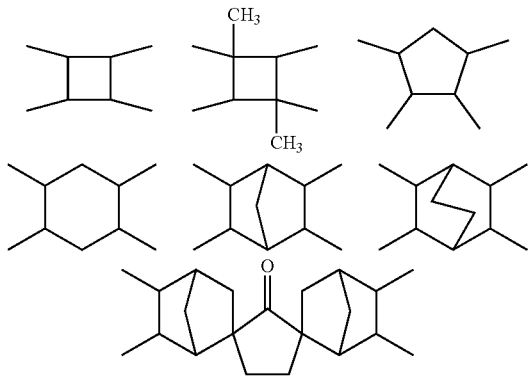

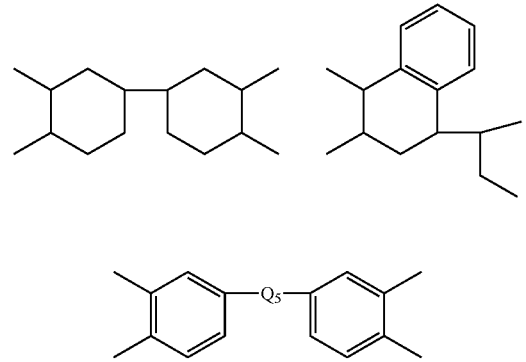

wherein Structural Formula 5 is:

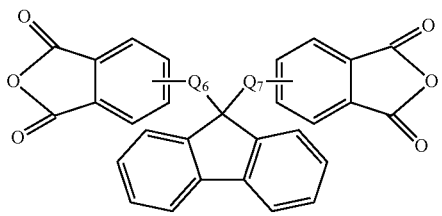

in which, in Structural Formula 4 and Structural Formula 5, $Q_5$, $Q_6$ and $Q_7$ are each independently selected from the group comprising a single bond, —O—, —S—, —$SO_2$—, —C(=O)—, —C(=O)O—, —C(=O)NH—, a phenylene group and a combination thereof.

2. The polyamic acid solution of claim 1, wherein: $Q_1$, $Q_2$, $Q_3$ and $Q_4$ are each selected from the group consisting of: a hydrogen, a halogen atom, or a $C_{1-10}$ fluoroalkyl containing a fluorine atom, wherein the alkyl group is selected from the group consisting of: a methyl group, an ethyl group, a propyl group, an isopropyl group, a t-butyl group, a pentyl group, and a naphthalenyl group.

3. The polyamic acid solution of claim 1, wherein the organic solvent is selected from the group consisting of: m-cresol, dimethylformamide (DMF), N-methyl-2-pyrrolidone (NMF), dimethylacetamide (DMAc), dimethylsulfoxide (DMSO), acetone and combinations thereof.

4. The polyamic acid solution of claim 1, wherein the solid content is in the range of from 15 to 35 wt %.

5. A transparent polyimide film manufactured from the polyamic acid solution of claim 1.

6. The polyimide film of claim 5, wherein:
the polyimide film has the following features:
a glass-transition temperature (Tg) of at least 350° C.;
a coefficient of thermal expansion (CTE) not exceeding 50 ppm/CC, based on measuring two times at 50 to 250° C.;
a birefringence not exceeding 0.06;
a light transmittance b* value not exceeding 5;
a yellowness index not exceeding 8;
a modulus of at least 4.0 Gpa; and
a transmittance of at least 88% at 550 nm, with a haze not exceeding 0.5%.

7. A substrate for a display or a semiconductor, comprising:
the colorless transparent polyimide film of claim 5.

8. A polyamic acid solution, comprising:
a product, containing at least one fluorinated substituent and one cardo structure, obtained by co-polymerizing, in an organic solvent, at least one diamine and at least one tetracarboxylic dianhydride;
wherein the molar ratio of total amount of diamine to the total amount of tetracarboxylic dianhydride is in the range of from 0.98 to 1.1;
wherein the at least one diamine is a combination of two monomers, one having Structural Formula 1 and the other having Structural Formula 2, such that the total diamine is in the range of from 60 mol % to 95 mol % Structural Formula 1;
wherein the at least one tetracarboxylic dianhydride is a combination of two monomers, one having Structural Formula 3 and the other having Structural Formula 4, such that, in the tetracarboxylic dianhydride:

Structural Formula 3 is present in the range of from 10 mol % to 40 mol %; and
Structural Formula 4 is present in the range of from 60 moi % to 90 mol %;
wherein Structural Formula 1 is:

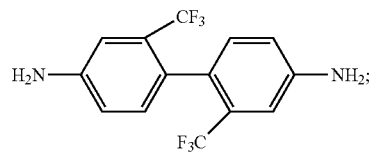 [SMILES: Nc1ccc(-c2ccc(N)cc2C(F)(F)F)c(C(F)(F)F)c1]

wherein Structural Formula 2 is:

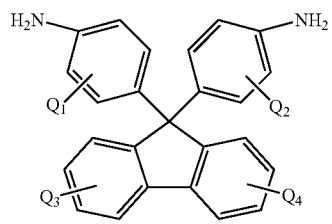

in which each of $Q_1$, $Q_2$, $Q_3$ and $Q_4$ are independently selected from the group consisting of: a hydrogen, a halogen, a hydroxyl group, a thiol group, a nitro group, a $C_{1-10}$ alkyl group, a $C_{1-4}$ halogenoalkoxyl group, a $C_{1-10}$ halogenoalkyl group, a cyano group and a $C_{6-20}$ aryl group;

wherein Structural Formula 3 is:

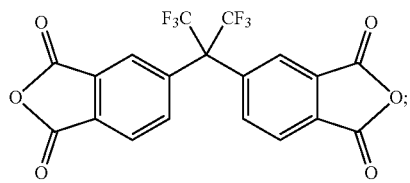 [SMILES: O=C1OC(=O)c2cc(C(c3ccc4c(c3)C(=O)OC4=O)(C(F)(F)F)C(F)(F)F)ccc21]

wherein Structural Formula 4 is:

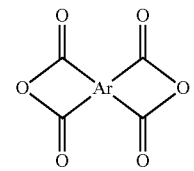

in which the substituent Ar is selected from the group consisting of any of the following structures:

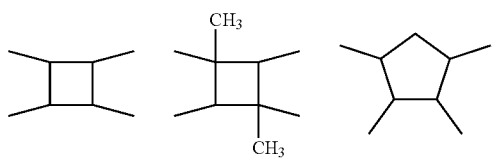

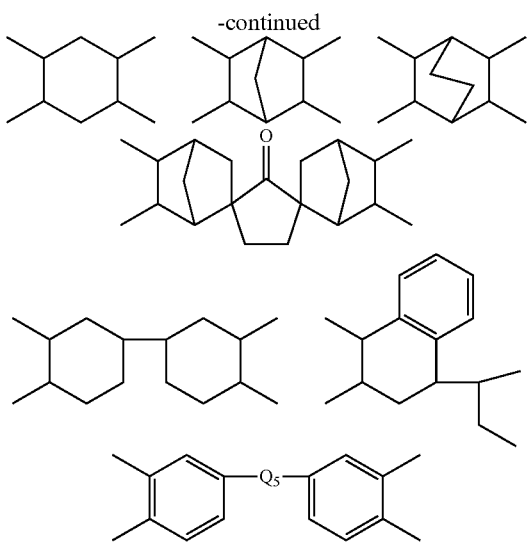

in which, in Structural Formula 4 $Q_5$ is selected from the group consisting of: a single bond, —O—, —S—, —$SO_2$—, —C(=O)—, —C(=O)O—, —C(=O)NH—, a phenylene group and a combination thereof.

9. The polyamic acid solution of claim 8, wherein:
$Q_1$, $Q_2$, $Q_3$ and $Q_4$ are each selected from the group consisting of: a hydrogen, a halogen atom, or a $C_{1-10}$ fluoroalkyl containing a fluorine atom, wherein the alkyl group is selected from the group consisting of: a methyl group, an ethyl group, a propyl group, an isopropyl group, a t-butyl group, a pentyl group, and a naphthalenyl group.

10. The polyamic acid solution of claim 8, wherein the organic solvent is selected from the group consisting of: m-cresol, dimethylformamide (DMF), N-methyl-2-pyrrolidone (NMP), dimethylacetamide (DMAc), dimethylsulfoxide (DMSO), acetone and combinations thereof.

11. The polyamic acid solution of claim 8, wherein the solid content is in the range of from 15 to 35 wt %.

12. A transparent polyimide film manufactured from the polyamic acid solution of claim 11.

13. The polyimide film of claim 12, wherein:
the polyimide film has the following features:
a glass-transition temperature (Tg) of at least 350° C.;
a coefficient of thermal expansion (CTE) not exceeding 50 ppm/° C., based on measuring two times at 50 to 250° C.;
a birefringence not exceeding 0.06;
a light transmittance b* value not exceeding 5;
a yellowness index not exceeding 8;
a modulus of at least 4.0 Gpa; and
a transmittance of at least 88% at 550 nm, with a haze not exceeding 0.5%.

14. A substrate for a display or a semiconductor, comprising:
the transparent polyimide film of claim 12.

* * * * *

UNITED STATES PATENT AND TRADEMARK OFFICE
CERTIFICATE OF CORRECTION

PATENT NO. : 11,697,710 B2
APPLICATION NO. : 16/533911
DATED : July 11, 2023
INVENTOR(S) : Jiang et al.

Page 1 of 1

It is certified that error appears in the above-identified patent and that said Letters Patent is hereby corrected as shown below:

On the Title Page

Item (71) Applicants, delete "RayiTEK Hi-tech Film Company, Ltd., Shenzhen, Shenzhen (CN)" and insert -- RAYITEK Hi-Tech Film Company, Ltd., Shenzhen, Shenzhen (CN) --.

In the Specification

In Column 7, Line 11, please delete "(0.08mop" and insert -- (0.08 mol) --.

In Column 10, Line 1, please delete "3.8° g" and insert -- 3.82 g --.

In the Claims

In Column 13, Line 17, Claim 1, please delete "a combination" and insert -- combinations --.

Signed and Sealed this
Eighth Day of August, 2023

Katherine Kelly Vidal
*Director of the United States Patent and Trademark Office*